United States Patent
Imaizumi (10) Patent No.: US 10,461,769 B2
(45) Date of Patent: Oct. 29, 2019

(54) ΔΣ MODULATOR

(71) Applicant: ABLIC Inc., Chiba-shi, Chiba (JP)

(72) Inventor: Eiki Imaizumi, Chiba (JP)

(73) Assignee: ABLIC INC., Chiba (JP)

(*) Notice: Subject to any disclaimer, the term of this patent is extended or adjusted under 35 U.S.C. 154(b) by 0 days.

(21) Appl. No.: 16/350,120

(22) Filed: Sep. 27, 2018

(65) Prior Publication Data

US 2019/0097647 A1    Mar. 28, 2019

(30) Foreign Application Priority Data

Sep. 28, 2017    (JP) .................................. 2017-188603

(51) Int. Cl.
*H03M 3/00*    (2006.01)
*H03F 3/45*    (2006.01)

(52) U.S. Cl.
CPC .......... *H03M 3/32* (2013.01); *H03F 3/45475* (2013.01); *H03M 3/34* (2013.01); *H03M 3/422* (2013.01); *H03M 3/50* (2013.01); *H03F 2203/45514* (2013.01); *H03M 3/43* (2013.01); *H03M 3/45* (2013.01); *H03M 3/452* (2013.01)

(58) Field of Classification Search
CPC .......... H03M 1/00; H03M 1/12; H03M 1/747; H03M 3/30; H03M 3/422; H03M 3/50; H03M 1/001; H03M 1/0626; H03M 1/0665; H03M 3/34; H03M 3/458; H03M 7/3004
USPC ........................................................ 341/143
See application file for complete search history.

(56) References Cited

U.S. PATENT DOCUMENTS

| | | | | |
|---|---|---|---|---|
| 4,994,804 A * | 2/1991 | Sakaguchi | .............. | H03M 3/34 341/143 |
| 5,148,167 A * | 9/1992 | Ribner | .................. | H03M 3/414 341/143 |
| 5,392,043 A * | 2/1995 | Ribner | .................. | H03M 3/342 341/143 |
| 8,207,879 B2 * | 6/2012 | Uo | .......................... | H03M 3/34 341/110 |
| 8,604,861 B1 * | 12/2013 | Ceballos | .................. | G06G 7/18 327/337 |
| 2003/0146786 A1 * | 8/2003 | Gulati | ................. | H03F 3/45973 330/9 |
| 2004/0239783 A1 * | 12/2004 | Imaizumi | ............... | H04N 5/335 348/255 |

(Continued)

FOREIGN PATENT DOCUMENTS

JP    2016-184792    10/2016

*Primary Examiner* — Linh V Nguyen
(74) *Attorney, Agent, or Firm* — Brinks, Gilson & Lione (57) ABSTRACT

A ΔΣ modulator includes a first integrator which has first and second capacitors and integrates an analog input signal and a feedback analog signal, a second integrator which has third and fourth capacitors and integrates an output signal of the first integrator, a differential amplifier which has input and output terminals switched and connected via a switch circuit to either the first and second capacitors or the third and fourth capacitors, a chopper switch which switches the polarity of the input terminal and the polarity of the output terminal, to both of which the first capacitor and the second capacitor are connected, a quantizer which compares an added signal and a reference signal to output a digital value, and a digital/analog converter which outputs the feedback analog signal corresponding to the digital value.

2 Claims, 5 Drawing Sheets

(56) References Cited

U.S. PATENT DOCUMENTS

2016/0285471 A1\* 9/2016 Imaizumi ................ H03M 3/32
2018/0183456 A1\* 6/2018 Lee ..................... H03M 1/0626

\* cited by examiner

ΔΣ MODULATOR

RELATED APPLICATIONS

This application claims priority under 35 U.S.C. § 119 to Japanese Patent Application No. 2017-188603 filed on Sep. 28, 2017, the entire content of which is hereby incorporated by reference.

BACKGROUND OF THE INVENTION

1. Field of the Invention

The present invention relates to a high-order ΔΣ modulator used in a ΔΣ analog/digital converter.

2. Description of the Related Art

An analog/digital converter is classified as a Nyquist rate analog/digital converter or an oversample analog/digital converter. An oversample analog/digital converter, especially, a ΔΣ analog/digital converter, is easy to realize high accuracy and small in circuit scale, and often used in measurement applications whose signal band is relatively narrow.

The ΔΣ analog/digital converter is constructed from: a ΔΣ modulator including plural stages of amplifying integrators which amplify and integrate a differential signal between an input analog signal and a prescribed feedback analog signal, a quantizer which digitizes the output of each amplifying integrator to obtain a digital value, and a digital/analog converter which generates a feedback analog signal from the digital value; and a digital filter including a decimation filter or the like which calculates a final analog/digital conversion value from a sequence of digital values provided from the ΔΣ modulator. Since the ΔΣ analog/digital converter depends on the configuration of the ΔΣ modulator in terms of accuracy, the amplifying integrators are connected in series in plural stages in order to realize high accuracy.

However, there has been a demand for the recent ΔΣ modulator to have reduced circuit size and less current consumption while having high accuracy.

Figure 4:
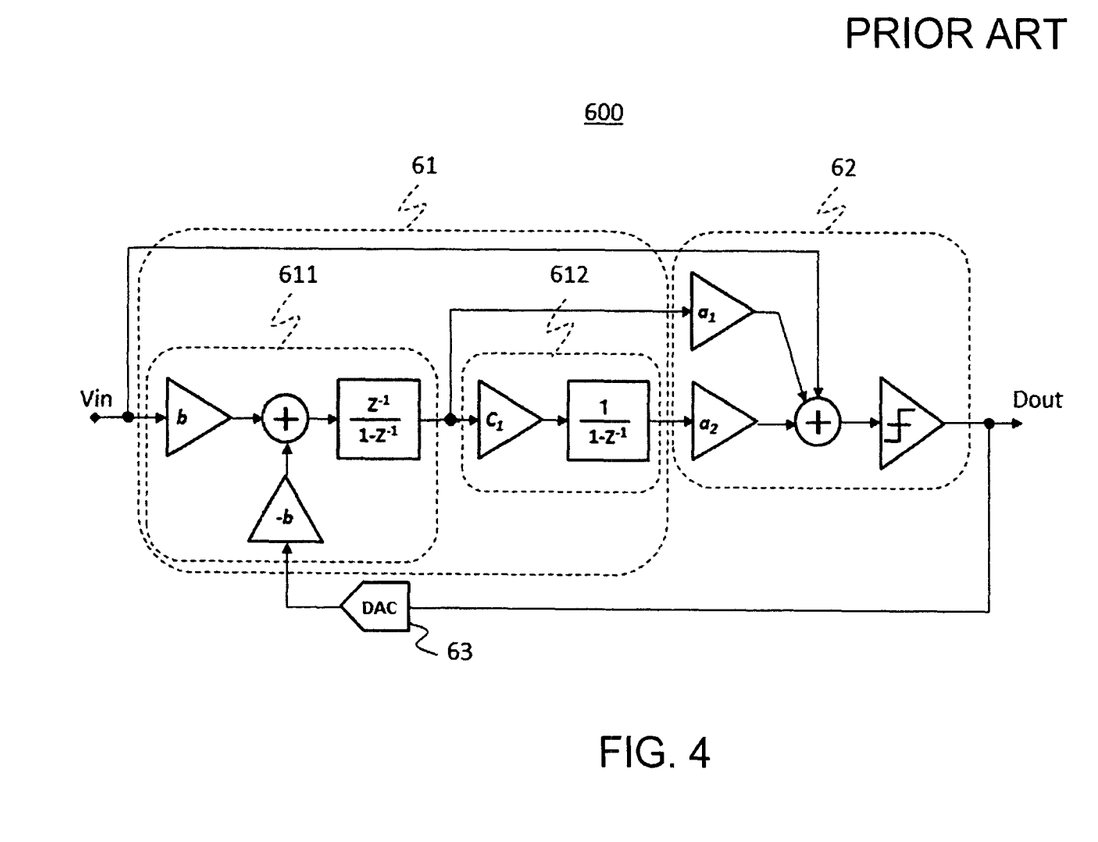
FIG. 4 is a block diagram illustrating a related art second-order ΔΣ modulator.

FIG. 4 is a block diagram illustrating a second-order ΔΣ modulator 600 of related art.

The ΔΣ modulator 600 of related art includes an amplifying integrator 61 constructed from a first-stage differential amplifying integrator 611 and a second-stage amplifying integrator 612 both supplied with an input signal Vin, a quantizer 62 which outputs a digital signal Dout, and a digital/analog converter 63 which converts the digital signal Dout into an analog signal.

The first-stage differential amplifying integrator 611 includes an amplifier which amplifies the input signal Vin (multiplied by b), an amplifier which amplifies the analog signal (multiplied by −b), an addition circuit which adds output signals of the two amplifiers, and an integrator which integrates the output of the addition circuit.

The second-stage amplifying integrator 612 includes an amplifier which amplifies the output of the first-stage differential amplifying integrator 611 (multiplies it by $c_1$), and an integrator which integrates the output of the amplifier. The integrator includes a delay-free integrator.

The quantizer 62 includes an adder which adds the input signal Vin, an amplified signal (multiplied by $a_1$) obtained by amplifying the output of the first-stage differential amplifying integrator 611, and an amplified signal (multiplied by $a_2$) obtained by amplifying the output of the second-stage amplifying integrator 612, and a comparator which compares the so-added signal and a prescribed reference voltage.

Figure 5:
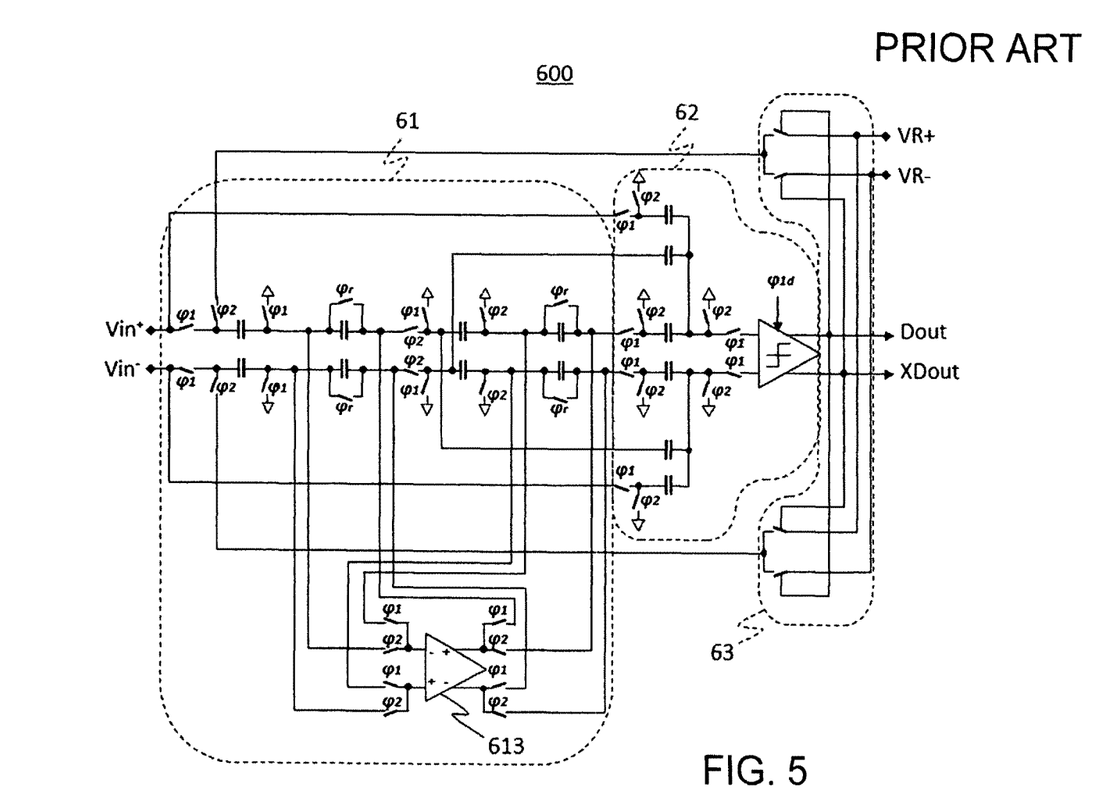
FIG. 5 is a circuit diagram illustrating the related art second-order ΔΣ modulator.

FIG. 5 is a circuit diagram illustrating the related art ΔΣ modulator 600. The ΔΣ modulator 600 defines the input signal as differential signals (Vin+, Vin−) to output a digital signal Dout (XDout). Further, the differential amplifying integrator 611 and the amplifying integrator 612 are constructed by a switched capacitor amplifier capable of realizing an amplifying function and an integrating function integrally. Then, the switched capacitor amplifier which configures the differential amplifying integrator 611 and the amplifying integrator 612 is constructed to switch and share an amplifier 613 by a switch circuit since the differential amplifying integrator 611 and the amplifying integrator 612 are operated in modes opposite to each other.

With the above configuration, the related art ΔΣ modulator 600 is made small in circuit scale and reduced in current consumption while being high in accuracy (refer to Japanese Patent Application Laid-Open No. 2016-184792).

SUMMARY OF THE INVENTION

In the related art ΔΣ modulator 600, however, there is a case in which the offset voltage of the amplifier 613 used in the switched capacitor amplifier deteriorates the accuracy of analog/digital conversion.

The present invention aims to reduce an influence of an offset voltage of an amplifier in a ΔΣ modulator sharing the amplifier on the accuracy of analog/digital conversion.

In order to solve the related-art problems, a ΔΣ modulator according to one aspect of the present invention is provided which includes: a first integrator which has first and second capacitors and integrates an analog input signal and a feedback analog signal, a second integrator which has third and fourth capacitors and integrates an output signal of the first integrator, a differential amplifier which has input and output terminals switched and connected via a switch circuit to the first and second capacitors or the third and fourth capacitors, a chopper switch which switches the polarity of the input terminal and the polarity of the output terminal, to both terminals of which the first capacitor and the second capacitor are connected, a quantizer which compares a signal obtained by adding the analog input signal, an output signal of the first integrator, and the output signal of the second integrator and a reference signal to output a digital value, and a digital/analog converter which outputs the feedback analog signal according to the digital value provided from the quantizer.

Further, there is provided a ΔΣ modulator according to another aspect of the present invention, which includes: a first integrator which has first and second capacitors and integrates an analog input signal and a feedback analog signal, a second integrator which has third and fourth capacitors and integrates an output signal of the first integrator, a differential amplifier which has input and output terminals switched and connected via a switch circuit to the first and second capacitors or the third and fourth capacitors, a quantizer which compares a signal obtained by adding the analog input signal, the output signal of the first integrator, and an output signal of the second integrator and a reference signal to output a digital value, and a digital/analog converter which outputs the feedback analog signal according to the digital value provided from the quantizer, in which the differential amplifier is a chopper amplifier which switches the polarity of the input terminal and the polarity of the output terminal, to both terminals of which the first and second capacitors or the third and fourth capacitors are connected.

According to one aspect of the present invention, there is provided a ΔΣ modulator equipped with a plurality of stages of amplifying integrators. In the ΔΣ modulator, differential amplifiers used in the first and next stages are constructed to be used in common by a single differential amplifier, and a first-stage integrator is constructed to switch the connection to the shared differential amplifier. It is therefore possible to reduce an influence of an offset voltage of the differential amplifier used for an amplifying integral operation of the first stage on the accuracy of analog/digital conversion.

DETAILED DESCRIPTION OF THE PREFERRED EMBODIMENTS

Figure 1:
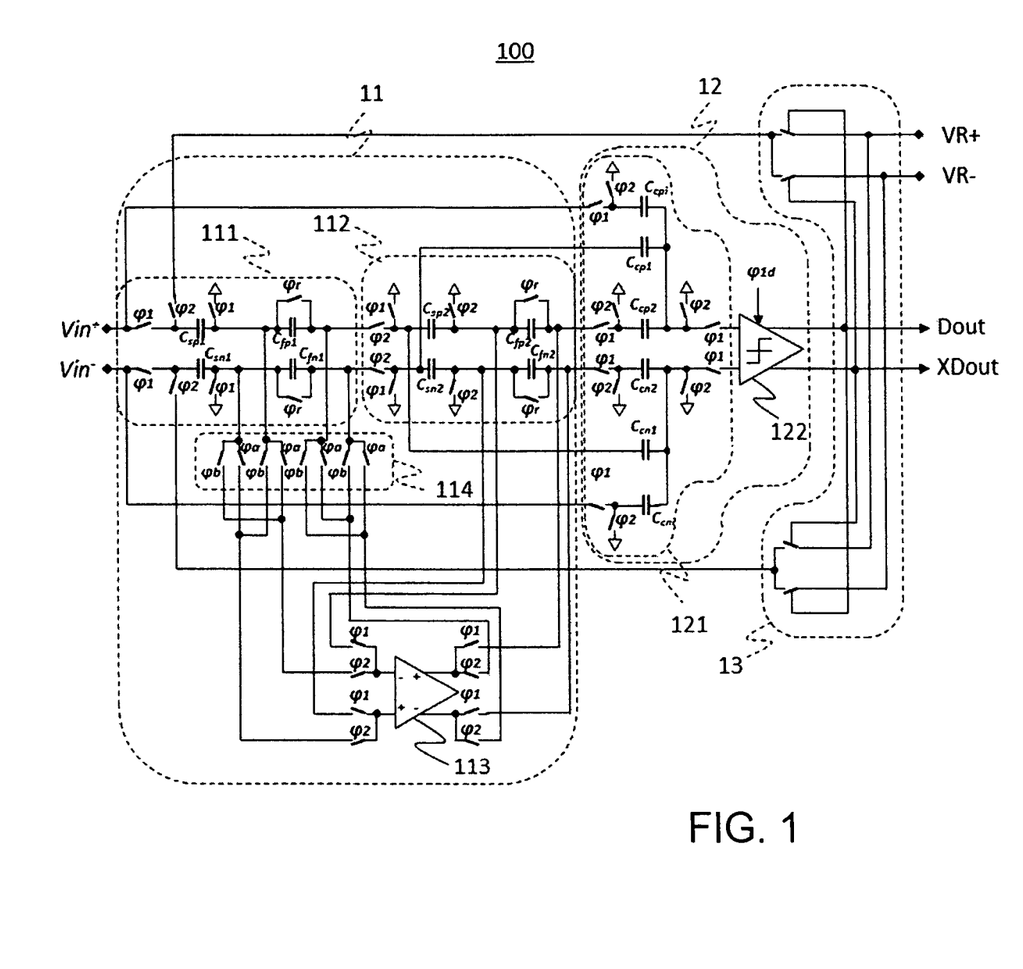
FIG. 1 is a circuit diagram illustrating a second-order ΔΣ modulator according to a first embodiment.

FIG. 1 is a circuit diagram illustrating a second-order ΔΣ modulator 100 according to the first embodiment of the present invention.

The ΔΣ modulator 100 according to the present embodiment is equipped with an amplifying integrator 11, a quantizer 12, and a digital/analog converter 13.

The amplifying integrator 11 is equipped with a first-stage integrator 111 having sample capacitors Csp1 and Csn1, feedback capacitors Cfp1 and Cfn1 for integration, and a plurality of switches, an integrator 112 having sample capacitors Csp2 and Csn2, feedback capacitors Cfp2 and Cfn2 for integration, and a plurality of switches, a plurality of switches and a differential amplifier 113 for transferring the electric charges of the sample capacitors Csp1 and Csn1 and Csp2 and Csn2 in the integrators 111 and 112 to the feedback capacitors Cfp1 and Cfn1 and Cfp2 and Cfn2 respectively and amplifying and integrating them, and a chopper switch 114 which switches the polarity of input/output terminals of the differential amplifier 113 to which the feedback capacitors Cfp1 and Cfn1 of the integrator 111 are connected.

The quantizer 12 is equipped with sample capacitors Ccpi and Ccni sampling input signals Vin+ and Vin− respectively, sample capacitors Ccp1 and Ccn1 respectively sampling an integral voltage provided from the integrator 111, and sample capacitors Ccp2 and Ccn2 respectively sampling an integral voltage provided from the integrator 112 and equipped with an addition circuit 121 which adds their voltages, and a comparator 122 which compares an addition signal provided from the addition circuit 121 and a prescribed reference voltage.

The digital/analog converter 13 is equipped with switches each of which outputs a voltage VR+ or a voltage VR− according to an output signal of the quantizer 12.

A circuit constructed by the sample capacitors Csp1 and Csn1, the feedback capacitors Cfp1 and Cfn1, and the plural switches also has an adding function and an amplifying function by being connected with the differential amplifier 113, but is referred to as an integrator for convenience of description. Further, a circuit constructed by the sample capacitors Csp2 and Csn2, the feedback capacitors Cfp2 and Cfn2, and the plural switches has an amplifying function by being connected with the differential amplifier 113, but is called an integrator for convenience of description.

Figure 2:
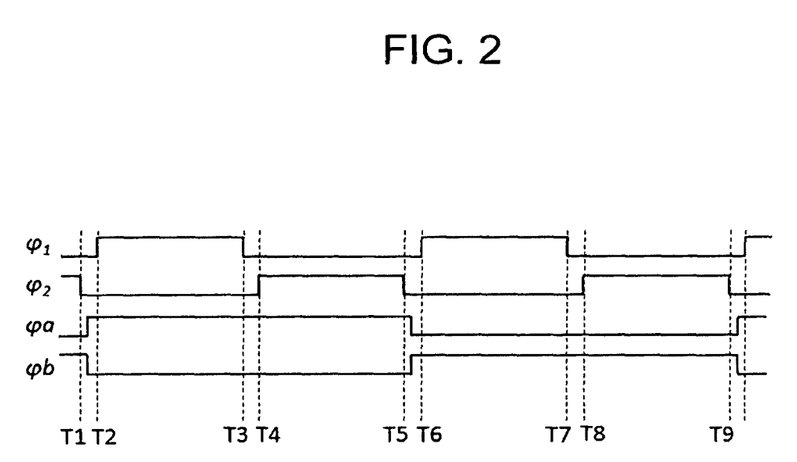
FIG. 2 is a timing chart illustrating one example of a control signal of each switch.

The ΔΣ modulator 100 according to the present embodiment defines input signals as differential signals Vin+ and Vin− and defines an output signal as a digital signal Dout (XDout). Clocks φ1, and φ2, φa, and φb being control signals of the respective switches are such waveforms as illustrated in FIG. 2, for example. Each switch is constructed to be on when the control signal is high and off when the control signal is low. The integrators 111 and 112 serve as a ½-clock delay switched capacitor amplifier. Further, since a clock φr is a signal to reset the feedback capacitors Cfp1, Cfn1, Cfp2, and Cfn2 in an initial state, it is not illustrated in the drawing in particular.

When the clock φ1 is high and the clock φ2 is low, the integrator 111 samples the input signals Vin+ and Vin− into the sample capacitors Csp1 and Csn1 respectively.

When the clock φ1 is low and the clock φ2 is high, the integrator 111 applies the voltage VR+ or VR− being a feedback analog signal to the sample capacitors Csp1 and Csn1 in accordance with the digital signal Dout provided from the quantizer 12.

Further, when the clock φ1 is low and the clock φ2 is high, the integrator 111 transfers the electric charges sampled into the sample capacitors Csp1 and Csn1 to the feedback capacitors Cfp1 and Cfn1 and integrates and outputs their electric charges with the input and output of the differential amplifier 113 being connected to both ends of each of the feedback capacitors Cfp1 and Cfn1.

When the clock φ1 is high and the clock φ2 is low, the integrator 112 transfers the electric charges sampled into the sample capacitors Csp2 and Csn2 to the feedback capacitors Cfp2 and Cfn2 and integrates and outputs their electric charges with the input and output of the differential amplifier 113 being connected to both ends of each of the feedback capacitors Cfp2 and Cfn2.

When the clock φ1 is low and the clock φ2 is high, the integrator 112 samples an integral voltage provided from the integrator 111 at each of the sample capacitors Csp2 and Csn2.

When the clock φ1 is high and the clock φ2 is low, the differential amplifier 113 is connected to the integrator 112. When the clock φ1 is low and the clock φ2 is high, the differential amplifier 113 is connected to the integrator 111 through the chopper switch 114.

The chopper switch 114 switches, based on the clocks φa and φb, the polarity of the input/output terminals of the differential amplifier 113 to which the feedback capacitors Cfp1 and Cfn1 of the integrator 111 are connected.

When the clock φ1 is high and the clock φ2 is low, the addition circuit 121 of the quantizer 12 is applied with the input signals Vin+ and Vin− at the capacitors Ccpi and Ccni, applied with a ground potential at the capacitors Ccp1 and Ccn1, and applied with the integral voltage of the integrator 112 at the capacitors Ccp2 and Ccn2, and adds those voltages. Then, the comparator 122 of the quantizer 12 compares the so-added voltage with the prescribed reference voltage and thereby outputs a digital signal Dout.

When the clock φ1 is low and the clock φ2 is high, the addition circuit 121 of the quantizer 12 is applied with the ground potential at the capacitors Ccpi and Ccni, applied with the integral voltage of the integrator 111 at the capacitors Ccp1 and Ccn1, and applied with the ground potential at the capacitors Ccp2 and Ccn2 to thereby perform a sample operation.

The operation of the ΔΣ modulator 100 according to the present embodiment will hereinafter be described in accordance with a timing chart of FIG. 2.

When the clock φ2 becomes low at a time T1, and the clock φ1 becomes high at a time T2, the integrator 111 samples the input signals Vin+ and Vin− into the sample capacitors Csp1 and Csn1 at times T2 to T3.

The addition circuit 121 of the quantizer 12 is applied with the input signal Vin+ at the capacitor Ccpi, applied with the input signal Vin− at the capacitor Ccni, applied with the ground potential at the capacitors Ccp1 and Ccn1 and applied with the integral voltage of the integrator 112 at the capacitors Ccp2 and Ccn2, and adds their voltages. Then, the comparator 122 of the quantizer 12 compares the so-added voltage with the prescribed reference voltage to output a digital signal Dout.

The digital/analog converter 13 outputs the voltage VR+ when the output signal Dout of the quantizer 12 is high. When the output signal Dout of the quantizer 12 is low, the digital/analog converter 13 outputs the voltage VR−.

Next, when the clock φ1 becomes low at the time T3, and the clock φ2 becomes high at a time T4, at times T4 to T5, the integrator 111 is applied with the voltage VR+ or VR− provided from the digital/analog converter 13 at the sample capacitors Csp1 and Csn1.

Further, the integrator 111 transfers the electric charges sampled into the sample capacitors Csp1 and Csn1 to the feedback capacitors Cfp1 and Cfn1, and since the input/output terminals of the differential amplifier 113 are connected to both ends of the feedback capacitors Cfp1 and Cfn1 through the chopper switch 114, the integrator 111 integrates and outputs their electric charges.

The integrator 112 samples the integral voltage provided from the integrator 111 into the sample capacitors Csp2 and Csn2.

The addition circuit 121 of the quantizer 12 is applied with the ground potential at the sample capacitors Ccpi and Ccni, applied with the integral voltage of the integrator 111 at the sample capacitors Ccp1 and Ccn1 and applied with the ground potential at the sample capacitors Ccp2 and Ccn2, and is in a sample operation state. Hence the addition circuit 121 does not output the voltage to the comparator 122.

Next, when the clock φ2 becomes low at the time T5, and the clock φ1 becomes high at a time T6, at the times T6 to T7, the integrator 112 transfers the electric charges sampled into the sample capacitors Csp2 and Csn2 to the feedback capacitors Cfp2 and Cfn2 and integrates and outputs their electric charges with the input/output terminals of the differential amplifier 113 being connected to both ends of the feedback capacitors Cfp2 and Cfn2 through the chopper switch 114.

The addition circuit 121 of the quantizer 12 adds respective ones of the input signals Vin+ and Vin− applied at the sample capacitors Ccpi and Ccni, the ground potential applied at the sample capacitors Ccp1 and Ccn1 and the integral voltage of the integrator 112 applied at the sample capacitors Ccp2 and Ccn2. Then, the comparator 122 compares the so-added voltage with the prescribed reference voltage to output a digital signal Dout.

The digital/analog converter 13 outputs the voltage VR+ when the output signal Dout of the quantizer 12 is high. When the output signal Dout of the quantizer 12 is low, the digital/analog converter 13 outputs the voltage VR−.

Further, the integrator 111 samples the input signals Vin+ and Vin− into the sample capacitors Csp1 and Csn1.

The ΔΣ modulator 100 according to the present embodiment repeats such an operation as described above to convert an input analog signal into a digital signal.

Here, the clock φa which controls the chopper switch 114 is switched to high between the times T1 and T2, and switched to low between the times T5 and T6. Further, the clock φa is switched to low between the times T1 and T2 and switched to high between the times T5 and T6.

Accordingly, at the times T4 to T5, the negative input terminal and positive output terminal of the differential amplifier 113 are connected to both ends of the feedback capacitor Cfp1. The positive input terminal and negative output terminal of the differential amplifier 113 are connected to both ends of the feedback capacitor Cfn1. Further, at times T8 to T9, the positive input terminal and negative output terminal of the differential amplifier 113 are connected to both ends of the feedback capacitor Cfp1, and the negative input terminal and positive output terminal of the differential amplifier 113 are connected to both ends of the feedback capacitor Cfn1.

Thus, in the integral processing at the times T4 to T5 and at the times T8 to T9, the connection between the differential amplifier 113 and the feedback capacitors Cfp1 and Cfn1 is switched to thereby cancel the influence of an offset voltage of the differential amplifier 113 in the integral operation of the first-stage integrator 111.

Specifically, since the offset voltage of the differential amplifier 113 is shifted to a region higher than the frequency of the clock φa (φb), the digital signal Dout (XDout) provided from the quantizer 12 can be removed by an unillustrated post-stage digital filter (low-pass filter in this case).

As described above, the ΔΣ modulator 100 according to the present embodiment is equipped with the chopper switch 114 which switches the polarity of the input/output terminals of the differential amplifier 113 to which the feedback capacitors Cfp1 and Cfn1 of the integrator 111 are connected. Thus, since the influence of the offset voltage of the differential amplifier 113 in analog/digital conversion can be removed, it is possible to realize a ΔΣ modulator of high accuracy.

The ΔΣ modulator 100 according to the present embodiment is constructed to switch between the first-stage integrator 111 and the differential amplifier 113 by the chopper switch 114 when the first-stage integrator 111 is connected to the differential amplifier 113. Since the influence of noise (offset voltage) of the first-stage integrator becomes dominant against the accuracy, the ΔΣ modulator can desire a sufficient effect.

Incidentally, although each of the clocks φa and φb has been described as a frequency of ½ of each of the clocks $\phi_1$ and $\phi_2$ in the present embodiment, it may be a frequency in a region sufficiently attenuated by the post-stage digital filter. Each of the clocks φa and φb is not necessarily required to be a single frequency and may include several frequency components.

Figure 3:
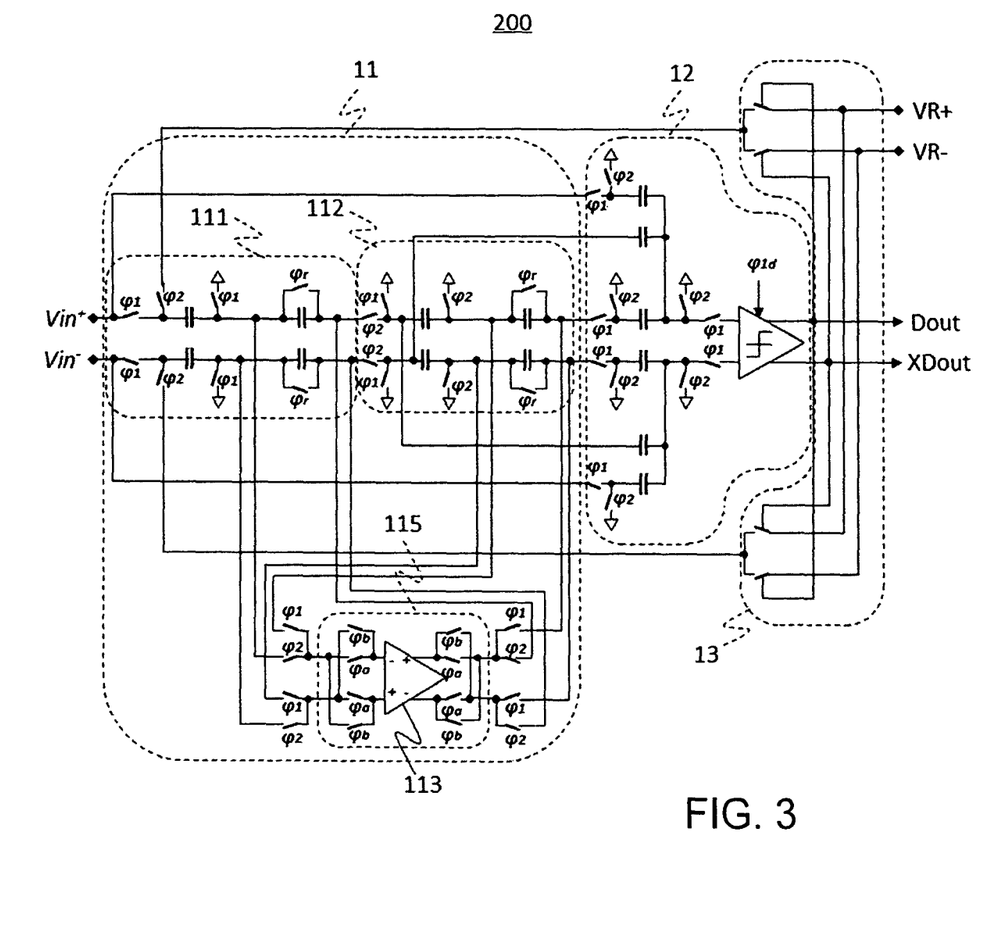
FIG. 3 is a circuit diagram illustrating a second-order ΔΣ modulator according to a second embodiment.

FIG. 3 is a circuit diagram illustrating a second-order ΔΣ modulator 200 according to the second embodiment.

The ΔΣ modulator 200 according to the second embodiment is equipped with an amplifying integrator 11, a quantizer 12, and a digital/analog converter 13. The ΔΣ modulator 200 has a configuration in which in the amplifying integrator 11 of the ΔΣ modulator 100, the differential amplifier 113 is provided as a chopper amplifier 115 further including a chopper switch, and the chopper switch 114 is omitted. Since other circuit configurations and control signals are similar to those in the ΔΣ modulator 100, their description will be omitted.

With the provision of the differential amplifier 113 as the chopper amplifier 115 in this way, an integrator 112 of the amplifying integrator 11 is also capable of switching the polarity of input/output terminals of the differential amplifier 113 to which feedback capacitors Cfp2 and Cfn2 are connected. Thus, in integral processing at times T2 to T3 and T6 to T7, the influence of an offset voltage of the differential amplifier 113 in the integral operation of the integrator 112 can also be canceled by switching the connection between the differential amplifier 113 and the feedback capacitors Cfp2 and Cfn2.

As described above, since the ΔΣ modulator 200 according to the present embodiment has adopted the chopper amplifier configuration in which the connections between the feedback capacitors Cfp1 and Cfn1 and Cfp2 and Cfn2 of the integrators 111 and 112 and the input/output terminals of the differential amplifier 113 are switched, the influence of the offset voltage of the differential amplifier 113 in analog/digital conversion can be removed. It is therefore possible to realize a ΔΣ modulator of high accuracy.

Since the ΔΣ modulator 200 according to the present embodiment has adopted the chopper amplifier configuration in which the connection of the input/output terminals is switched when the integrator 111 and the integrator 112 are connected to the differential amplifier 113, an effect can be desired where the configuration of amplifying the input signals is provided even in the integrator 112.

Although the embodiments of the present invention have been described above, the present invention is not limited to these embodiments. For example, even when the common mode voltage of the input signals Vin+ and Vin− is different from the common mode voltage of the differential amplifier 113, and an offset exists in a signal range of the input signals Vin+ and Vin− and a differential range of the differential amplifier 113 respectively, the technical idea of the present invention can be applied, and a similar effect is obtained. Further, even when a three-order or more ΔΣ modulator is adopted, for example, the technical idea of the present invention can be applied, and a similar effect is obtained.

What is claimed is:

1. A ΔΣ modulator comprising:
a first integrator which has first and second capacitors and integrates an analog input signal and a feedback analog signal;
a second integrator which has third and fourth capacitors and integrates an output signal of the first integrator;
a shared differential amplifier alternatingly shared between the first integrator at a first time and the second integrator at a second time, which has input and output terminals, both of which are switched and connected via a switch circuit to the first and second capacitors at the first time and the third and fourth capacitors at the second time;
a chopper switch which switches a polarity of the input terminal and a polarity of the output terminal, to both terminals of which the first capacitor and the second capacitor are connected;
a quantizer which compares a signal obtained by adding the analog input signal, the output signal of the first integrator, and an output signal of the second integrator and a reference signal to output a digital value; and
a digital/analog converter which outputs the feedback analog signal according to the digital value provided from the quantizer.

2. A ΔΣ modulator comprising:
a first integrator which has first and second capacitors and integrates an analog input signal and a feedback analog signal;
a second integrator which has third and fourth capacitors and integrates an output signal of the first integrator;
a shared differential amplifier alternatingly shared between the first integrator at a first time and the second integrator at a second time, which has input and output terminals, both of which are switched and connected via a switch circuit to the first and second capacitors at the first time and the third and fourth capacitors at the second time;
a quantizer which compares a signal obtained by adding the analog input signal, the output signal of the first integrator, and an output signal of the second integrator and a reference signal to output a digital value; and
a digital/analog converter which outputs the feedback analog signal according to the digital value provided from the quantizer,
the differential amplifier including a chopper amplifier which switches a polarity of the input terminal and a polarity of the output terminal, said input and output terminals being connected alternatingly via the switch circuit with the first and second capacitors at the first time and the third and fourth capacitors at the second time.

* * * * *